(12) United States Patent
Shijo et al.

(10) Patent No.: US 9,730,368 B2
(45) Date of Patent: Aug. 8, 2017

(54) LEAKAGE PREVENTING DEVICE OF ELECTROMAGNETIC WAVE AND WIRELESS POWER TRANSMISSION SYSTEM

(71) Applicant: KABUSHIKI KAISHA TOSHIBA, Minato-Ku, Tokyo (JP)

(72) Inventors: Tetsu Shijo, Tokyo (JP); Akiko Yamada, Yokohama-Shi (JP); Shuichi Obayashi, Yokohama-Shi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 616 days.

(21) Appl. No.: 14/183,808

(22) Filed: Feb. 19, 2014

(65) Prior Publication Data
US 2014/0239730 A1 Aug. 28, 2014

(30) Foreign Application Priority Data

Feb. 22, 2013 (JP) ................................ 2013-033737

(51) Int. Cl.
*H01F 27/42* (2006.01)
*H05K 9/00* (2006.01)
(Continued)

(52) U.S. Cl.
CPC .......... *H05K 9/0075* (2013.01); *B60L 11/182* (2013.01); *B60L 11/1829* (2013.01);
(Continued)

(58) Field of Classification Search
CPC ............. B60L 11/182; B60L 2270/147; Y02T 90/122; Y02T 10/7005; H01Q 1/52;
(Continued)

(56) References Cited

U.S. PATENT DOCUMENTS 4,701,731 A 10/1987 Hanson et al.
8,874,031 B2 10/2014 Kudo et al.
(Continued)

FOREIGN PATENT DOCUMENTS

CN 102694422 A 9/2012
EP 2 515 314 A1 10/2012
(Continued)

OTHER PUBLICATIONS

Shijo, T. et al., "Power Transmission System," U.S. Appl. No. 14/176,560, filed Feb. 10, 2014.
(Continued)

*Primary Examiner* — Jared Fureman
*Assistant Examiner* — Duc M Pham
(74) *Attorney, Agent, or Firm* — Finnegan, Henderson, Farabow, Garrett & Dunner, L.L.P.

(57) ABSTRACT

According to an embodiment, there is provided a leak preventing device of electromagnetic wave, including a metal pipe and a magnetic material part. The metal pipe is arranged to surround a periphery of a first electric power transmission device. The first electric power transmission device wirelessly transmits electric power to a second electric power transmission device via an electromagnetic wave. The second electric power transmission device is opposed to the first electric power transmission device. An opening is formed on the metal pipe along a circumferential direction of the metal pipe. The magnetic material part is arranged within the metal pipe along the circumferential direction the metal pipe.

14 Claims, 17 Drawing Sheets

(51) Int. Cl.
*B60L 11/18* (2006.01)
*H01Q 1/52* (2006.01)
*H02J 17/00* (2006.01)
*H01F 38/14* (2006.01)
*H01F 27/36* (2006.01)

(52) U.S. Cl.
CPC ........... *H01F 27/367* (2013.01); *H01F 38/14* (2013.01); *H01Q 1/52* (2013.01); *H02J 17/00* (2013.01); *B60L 2270/147* (2013.01); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
CPC ...... H02J 17/00; H05K 9/0075; H01F 27/367; H01F 38/14
USPC .......................................... 307/104
See application file for complete search history.

(56) References Cited

U.S. PATENT DOCUMENTS

| | | | |
|---|---|---|---|
| 9,126,491 B2 | 9/2015 | Ichikawa | |
| 2010/0073248 A1* | 3/2010 | Motta Cruz | H01Q 13/0225 343/772 |
| 2012/0103741 A1* | 5/2012 | Suh | B60L 11/007 191/10 |
| 2012/0242447 A1* | 9/2012 | Ichikawa | B60L 11/182 336/84 C |
| 2014/0246918 A1 | 9/2014 | Shijo et al. | |
| 2014/0361632 A1 | 12/2014 | Obayashi et al. | |

FOREIGN PATENT DOCUMENTS

| | | |
|---|---|---|
| JP | S57-136197 U | 8/1982 |
| JP | 2007-13311 A | 1/2007 |
| JP | 2010/509795 A | 3/2010 |
| JP | 4865451 | 1/2011 |
| WO | WO 2010/025470 A2 | 3/2010 |
| WO | WO-2011/074091 A1 | 6/2011 |
| WO | WO 2012/144658 A2 | 10/2012 |

OTHER PUBLICATIONS

Extended European Search Report issued by the European Patent Office on Jun. 5, 2014, for European Patent Application No. 14155597.9.
Obayashi, U.S. Appl. No. 14/299,528, filed Jun. 9, 2014.
Notification of Reasons for Refusal mailed on May 13, 2016, for corresponding Japanese patent application No. 2013-033737, with machine translation (5 pages).
Notification of the First Office Action mailed on May 30, 2016, in corresponding Chinese patent application No. 201410057362.4, with translation (11 pages).
Notification of Reasons for Refusal mailed on May 13, 2016, in corresponding Japanese patent application No. 2013-03373, with machine translation (5 pages).

* cited by examiner

LEAKAGE PREVENTING DEVICE OF ELECTROMAGNETIC WAVE AND WIRELESS POWER TRANSMISSION SYSTEM

CROSS-REFERENCE TO RELATED APPLICATIONS

This application is based upon and claims the benefit of priority from Japanese Patent Application No. 2013-033737, filed Feb. 22, 2013; the entire contents of which are incorporated herein by reference.

FIELD

Embodiments relate described herein to an electromagnetic wave leakage preventing device and a wireless power transmission system.

BACKGROUND

There has been a system wirelessly transmitting electric power to an electric vehicle and the like. In the relevant system, there has been a problem that on wirelessly transmitting the electric power, a part of an electromagnetic wave leaks to a periphery to reduce a transmission efficiency. As related art, a technology has been known in which a brush-shaped electric conductor is arranged to prevent elect wave leakage.

DETAILED DESCRIPTION

According to an embodiment, there is provided a leak preventing device of electromagnetic wave, including a metal pipe and a magnetic material part.

The metal pipe is arranged to surround a periphery of a first electric power transmission device. The first electric power transmission device wirelessly transmits electric power to a second electric power transmission device via an electromagnetic wave. The second electric power transmission device is opposed to the first electric power transmission device.

An opening is formed on the metal pipe along a circumferential direction of the metal pipe.

The magnetic material part is arranged within the metal pipe along the circumferential direction the metal pipe. Hereinafter, a description will be given of embodiments of the present invention with reference to the drawings.

First Embodiment

Figure 1:
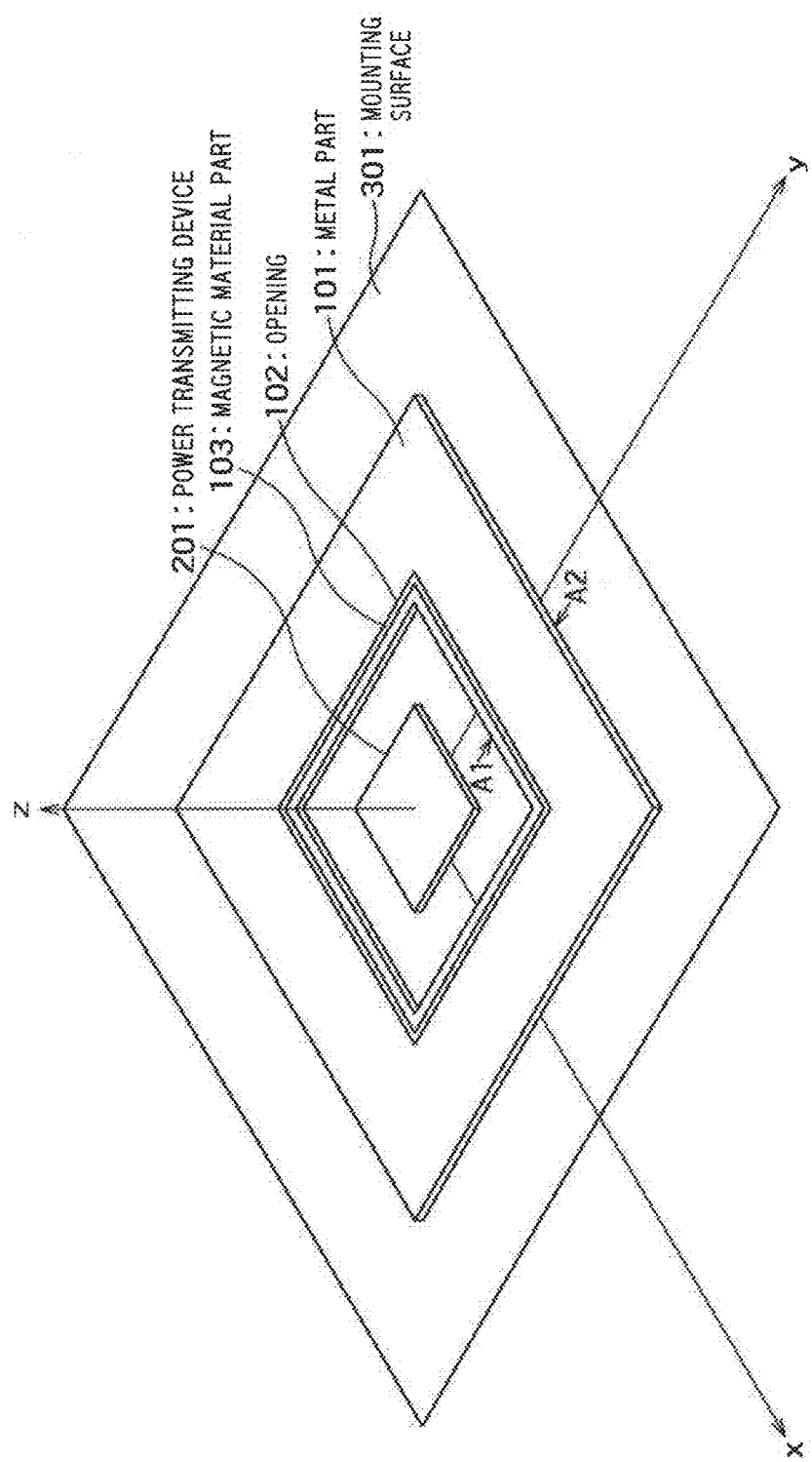
FIG. 1 is a perspective view showing a wireless power transmission system provided with a leakage preventing device of an electromagnetic wave according to a first embodiment.
Figure 2:
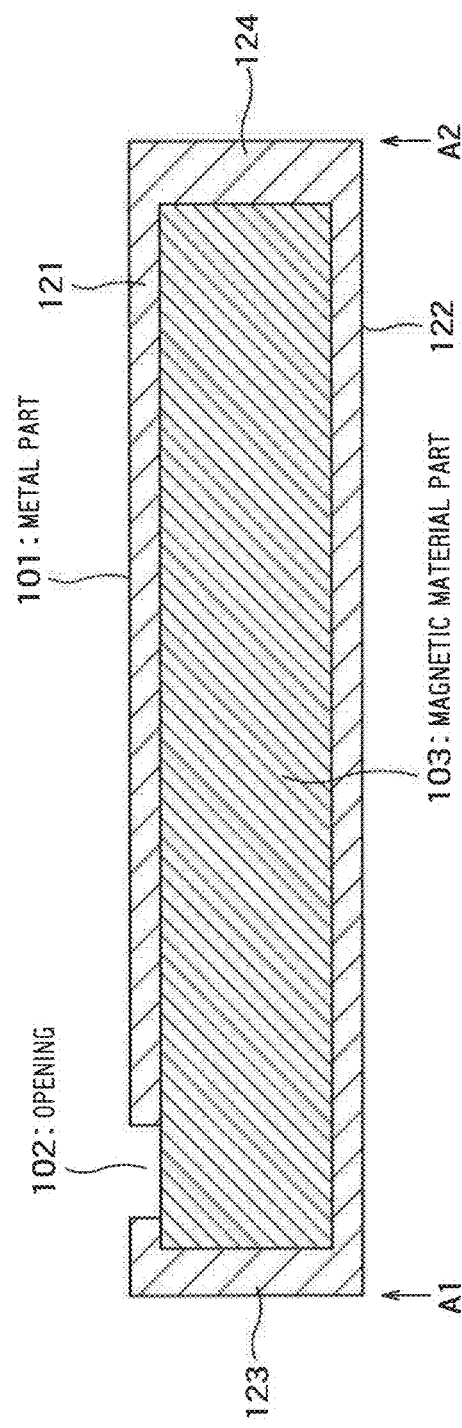
FIG. 2 is a sectional view of the leakage preventing device taken along an A1-A2 line of FIG. 1.

FIG. 1 is a perspective view of a wireless power transmission system provided with a leakage preventing device of an electromagnetic wave according to a first embodiment, FIG. 2 shows a sectional view of the leakage preventing device taken along an A1-A2 line of FIG. 1. Sectional views taken along those other than the A1-A2 line also are the same as FIG. 2.

This leakage preventing device is provided with respect to an electric power transmission device (power transmitting device or power receiving device) of the wireless power transmission system, and suppresses an electromagnetic wave from leaking to a periphery of the electric power transmission device on transmitting electric power. The electric power transmission device having the leakage preventing device arranged therefor may be a power transmitting device or power receiving device, and herein a case is shown of arranging in a power transmitting device.

A power transmitting device 201 is arranged on a ground plane (mounting surface) 301. The power transmitting device 201 wirelessly transmits the electric power to a power receiving device (refer to FIG. 5) arranged so as to be opposed thereto using the electromagnetic wave. For example, the power transmitting device 201 has a power transmitting coil and the power receiving device has a power receiving coil, and the electric power is transmitted between the power transmitting coil and the power receiving coil due to magnetic coupling. The ground plane 301 may be a finite conductive ground plane or the ground surface.

The leakage preventing device is arranged on or above the ground plane 301 with respect to the power transmitting device 201. The leakage preventing device as a whole has a shape surrounding the periphery of the power transmitting device 201. All or a part of the leakage preventing device may be embedded in the ground. This leakage preventing device functions to prevent the electromagnetic wave from leaking to the periphery (e.g., in a direction parallel to an xy-axis plain) on transmitting the electric power between the power transmitting device and the power receiving device. In a case where the ground plane 301 is a conductor plate, arrangement of the leakage preventing device on or above the conductor plate makes it possible to, besides a leakage preventing function above a land surface, prevent the electromagnetic wave from leaking down from a ground surface side. Note that the conductor plate may be not only a flat plate but also a netted, linear, or spiral shape. Further, the conductor plate and the leakage preventing device may be integrally formed.

The leakage preventing device includes a metal part (metal pipe) 101 arranged to surround the power transmitting device, and a magnetic material part 103 arranged within the metal pipe 101 along a circumferential direction of the metal pipe 101. In addition, the metal pipe 101 has an opening 102 formed along the circumferential direction of the metal pipe 101.

A general shape of the leakage preventing device seen from a z-axis direction, that is, a shape of the metal pipe 101 seen from the z-axis direction is a rectangle ring. However, ring shapes of the metal pipe 101, opening 102, and magnetic material part 103 are not limited to a rectangle, but may be other shapes such as a polygon, circle, ellipse and the like.

As shown in FIG. 2, the metal pipe 101 has a front side part 121, back side part 122, inward lateral side part 123, and outward lateral side part 124. The back side part 122 is opposed to the front side part 121 and is still opposed to the power receiving device (a second electric power transmission device) across the front side part 121. The inward lateral side part 123 is formed between one end of the front side part 121 and one end of the back side part 122 and surrounds a periphery of the power transmitting device 201. The outward lateral side part 124 is formed between the other end of the front side part 121 and the other end of the back side part 122 and surrounds the periphery of the power transmitting device 201 across the inward lateral side part 123. The opening 102 is formed on the front side part 121. The metal pipe 101 has the magnetic material part 103 as a flat plate magnetic material arranged inside thereof. The magnetic material part 103 is formed along the circumferential direction of the pipe to fill an inside the pipe. A length (width) between the inward lateral side part 123 and the outward lateral side part 124 is larger than a length (thickness) between the front side part 121 and the back side part 122.

Figure 3:
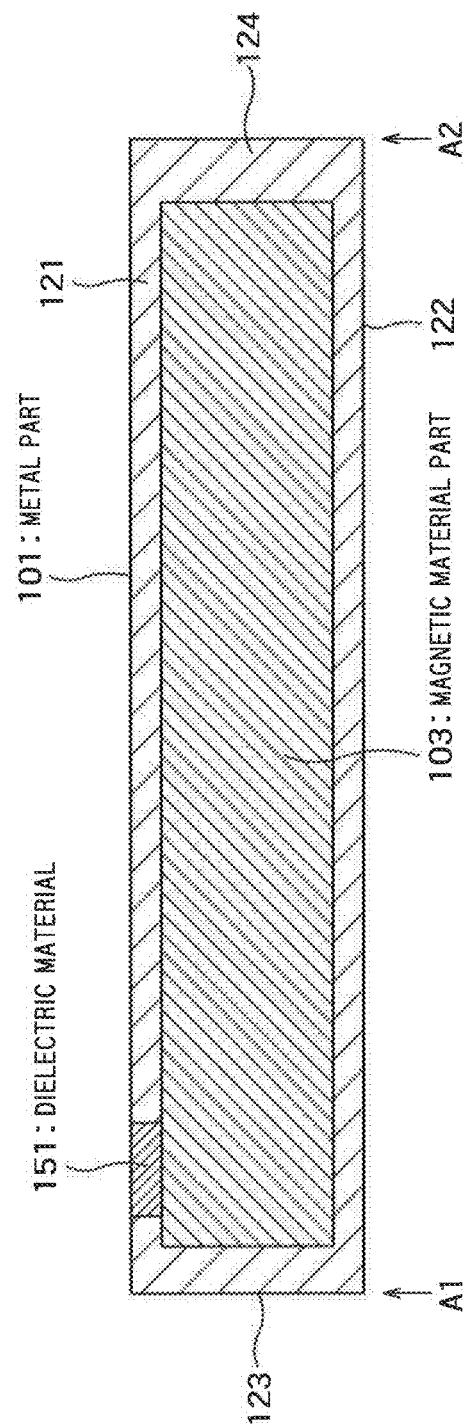
FIG. 3 is a diagram showing a modification example of the leakage preventing device according to the first embodiment.
Figure 4:
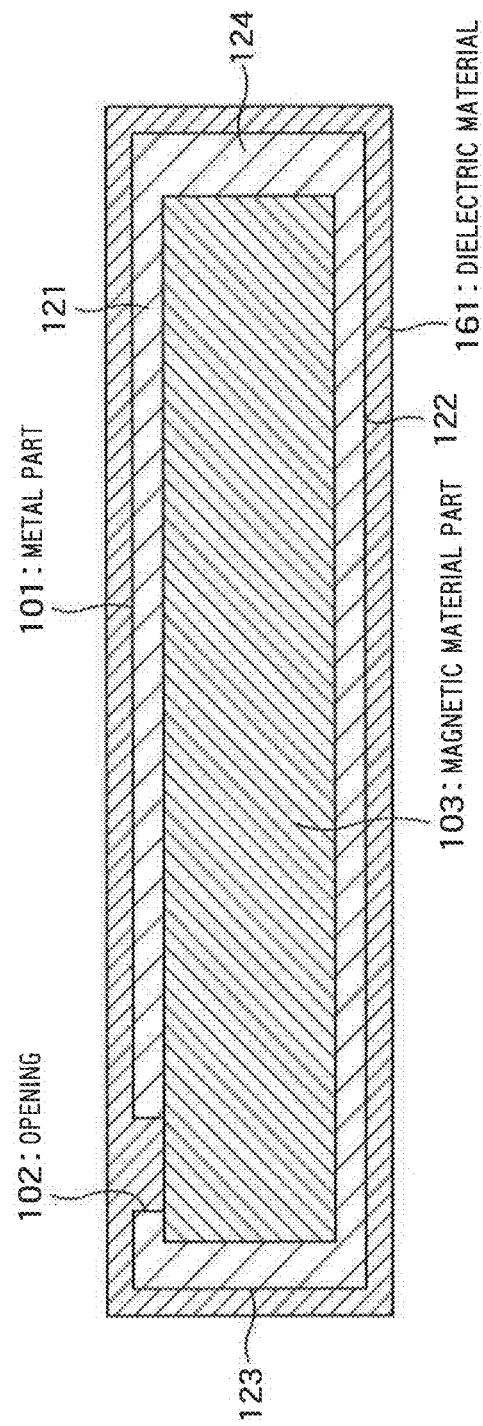
FIG. 4 is a diagram showing another modification example of the leakage preventing device according to the first embodiment.

Here, the opening 102 may have a dielectric material 151 formed therein as shown in FIG. 3. The dielectric material 151 can protect an inside of the metal pipe 101. Further, as shown in FIG. 4, the whole of the device, that is, the whole of the metal pipe 101 may be covered with the dielectric material 161. This can serve as a cover to protect this device.

A description will be given of a principal that leakage of the electromagnetic wave is decreased by this leakage preventing device using FIG. 5.

Figure 5:
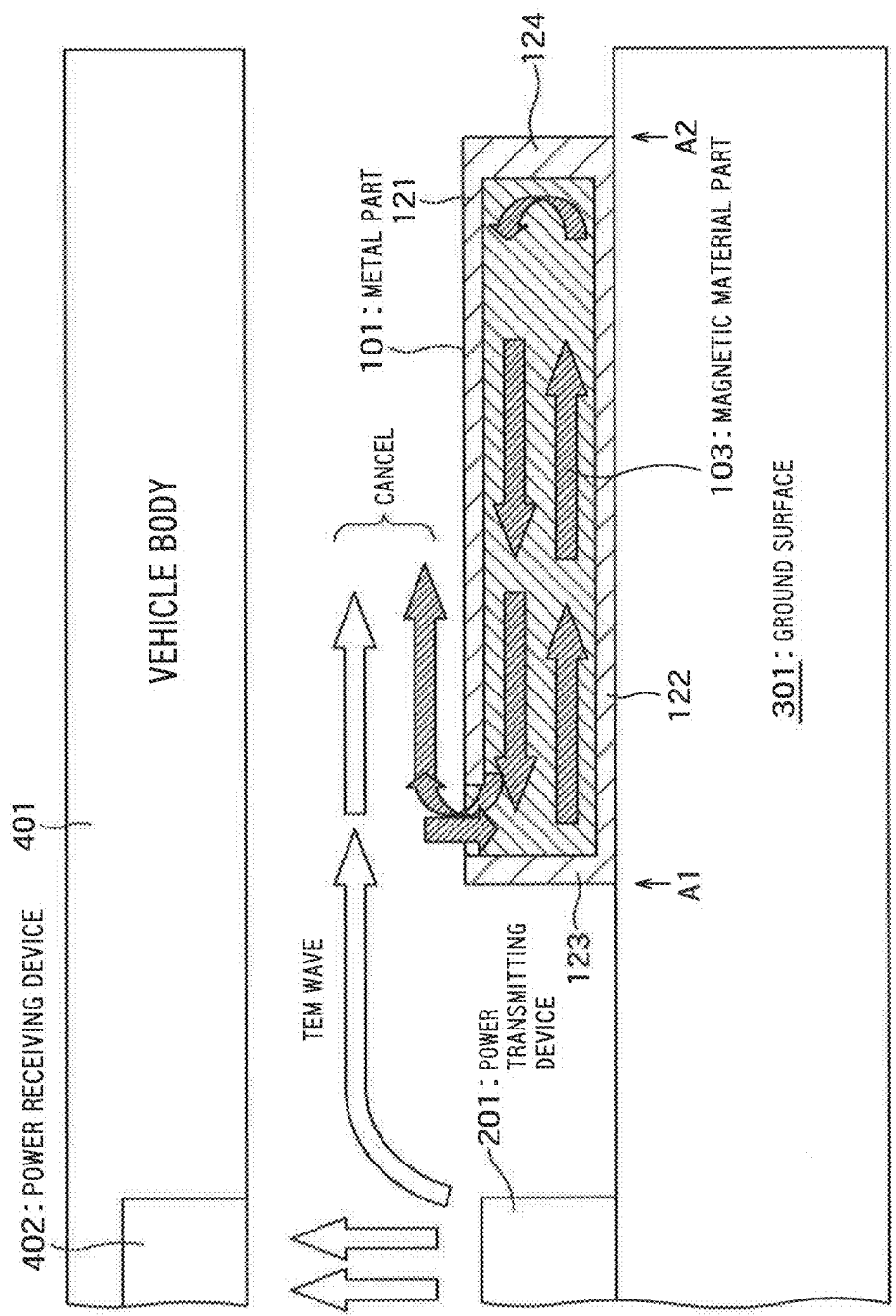
FIG. 5 is a diagram explaining a principal that leakage of an electromagnetic wave is decreased.

FIG. 5 shows an operation in a case where electric power is transmitted from the power transmitting device 201 arranged on the ground surface 301 to a power receiving device 402 of a vehicle (vehicle body) 401. Note that the opening 102 is formed at a position offset from a left end of a pipe space in FIG. 2, but in an example of FIG. 5 the opening is formed at the left end.

In transmitting the electric power from the power transmitting device 201 arranged on the ground surface 301 to the power receiving device 402 arranged in the vehicle 401, a part of the electromagnetic wave leaks out to the periphery. The ground surface 301 and the vehicle 401 operate as a kind of parallel plate, and the electromagnetic wave (TEM wave) having an electric field component in a vertical direction to the ground surface 301 is propagated in parallel to the ground surface 301 and leaks out to a space around the periphery. This part of the electromagnetic wave is coupled with the opening of the leakage preventing device to enter into the metal pipe. The entering electromagnetic wave propagates in the magnetic material 103. Existence of the magnetic material 103 in the metal pipe allows much electromagnetic wave to couple with the opening even if the opening is a small gap. The electromagnetic wave propagated in the magnetic material 103 is reflected on an end of the metal pipe (outward lateral side part 124) and the relevant electromagnetic wave is reradiated from the opening.

Figure 6:
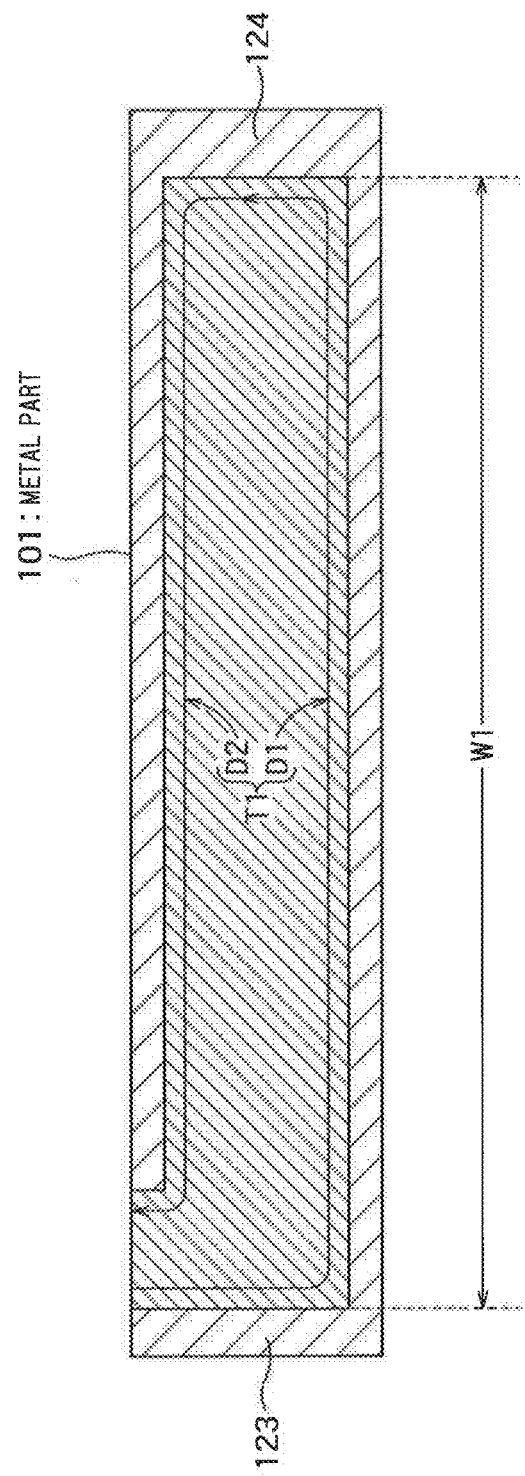
FIG. 6 is a diagram explaining a condition for a length of a propagation path.

Here, as shown in FIG. 6, a propagation path of an electromagnetic wave entering from the opening, propagating through the magnetic material part 103, and reflecting on an inner wall of the outward lateral side part 124 is defined as D1. In addition, a propagation path for the electromagnetic wave which is reflected on the outward lateral side part 124, propagated through the magnetic material part 103, and reradiated from the opening is defined as D2. The entire propagation path of D1 plus D2 is defined as T1. Lengths of the propagation paths D1 and D2 are equal to each other. At this time, if the length of the propagation path D1 is approximately ¼ of a wavelength in pipe with taking account of an wavelength shortening effect due to relative permeability of the magnetic material part 103, the electromagnetic wave reradiated from the opening is deviated in phase by 180 degrees from the electromagnetic wave leaked out from the power transmitting device. Therefore, the phases are canceled with each other as shown in FIG. 5. This allows the leaked electromagnetic wave to decrease to obtain a high transmission efficiency.

In other words, if the length of the entire propagation path T1 is approximately ½ of the wavelength in pipe, the leaked electromagnetic wave decrease due to the phase cancel.

In order to secure the path D1 of the about ¼ of the wavelength in pipe with taking account of the wavelength shortening effect due to the relative permeability, given that a frequency of the electromagnetic wave (operation frequency of the electric power transmission device) 100 kHz and a wavelength is 3 km, if a magnetic steel sheet having the relative permeability of about a hundred thousand is used, a width in pipe W1 (refer to FIG. 6) is 2.4 m around. Here, the width in pipe W1 is considered to be substantially equal to the length of the propagation path D1.

Not only in the case where the length of the propagation path D1 is about ¼ of the wavelength in pipe but also in the case of equal to or more than ⅛ and equal to or less than ⅜ of the wavelength in pipe, the effect can be obtained that the phase of the leaked electromagnetic wave and the phase of the electromagnetic wave reradiated from the opening are canceled with each other. Therefore, the length of the propagation path D1 (or width in pipe W1) may be equal to or more than ⅛ and equal to or less than ⅜ of the wavelength in pipe. More generally, the entire propagation path in the pipe from entering the opening to being reradiated may be equal to or more than ¼ and equal to or less than ¾ of the wavelength in pipe.

Here, as shown in FIG. 2, in the case where the position of the opening is offset from the left end of the pipe space, two propagation paths may be considered to mainly exist.

The first one is a path for the electromagnetic wave which enters from the opening, is propagated to the inward lateral side part 123, is reflected on the inward lateral side part 123, and is reradiated from the opening. The second one is, as shown in FIG. 5, a path for that which is propagated to the outward lateral side part 124, reflected on the outward lateral side part 124, and reradiated from the opening. In this way, in the case where a plurality of propagation paths exist, the longest path of these paths may only satisfy the above wavelength condition. In the example of FIG. 2, the longest path is the latter path, that is, the path with being propagated to the outward lateral side part 124, reflected on the outward lateral side part 124, and reradiated from the opening.

Figure 7:
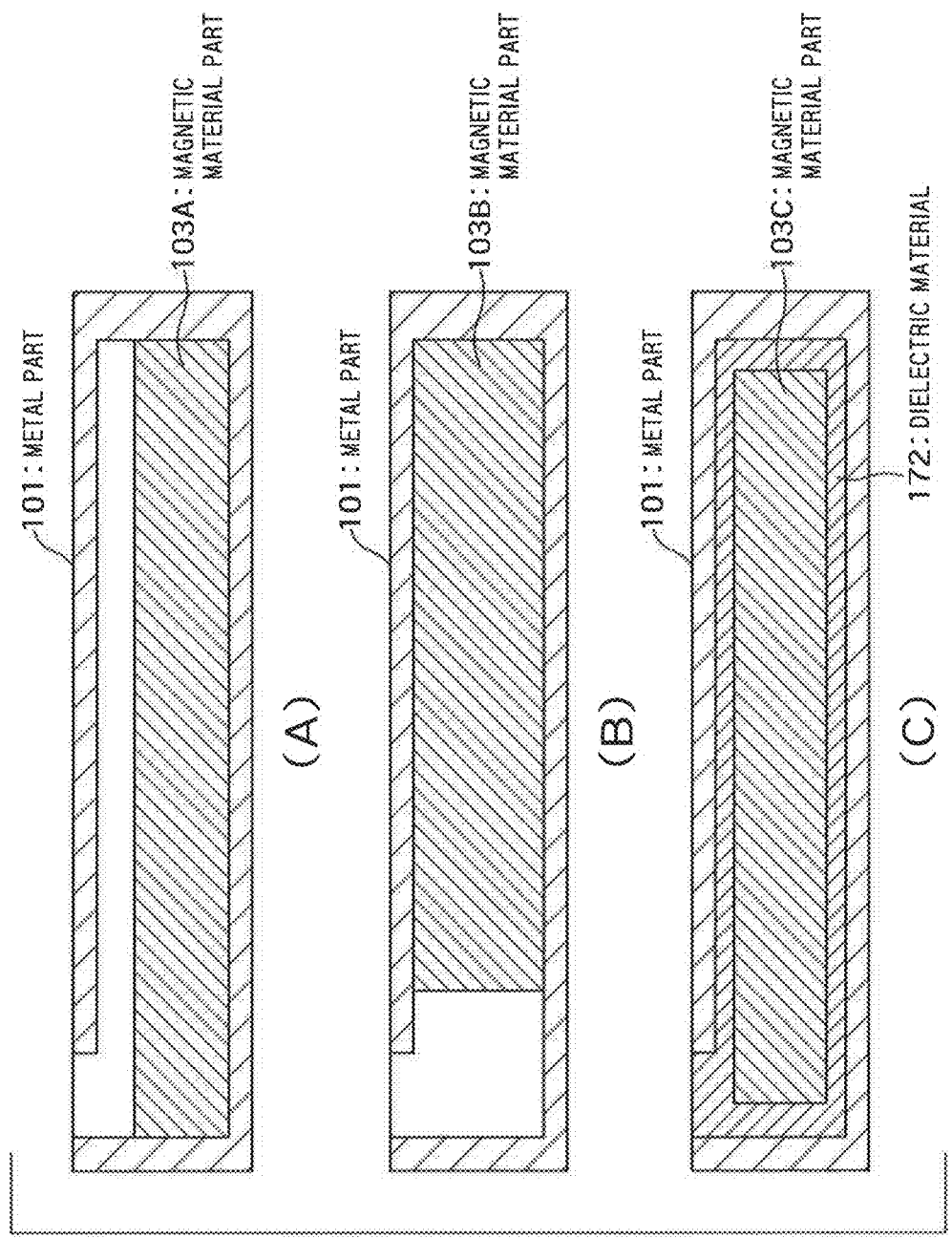
FIG. 7 is a diagram showing still another modification example of the leakage preventing device according to the first embodiment.

In addition, in the structure example shown above, the magnetic material part is arranged so as to entirely fill the inside of the pipe, but as show in FIG. 7(A) and FIG. 7(B), magnetic material parts 103A and 103E may be arranged so as to partially leave a gap in the pipe. Further, as show in FIG. 7(C), a dielectric material 172 or the like may be introduced into the pipe to cover the whole of a magnetic material part 103C with the dielectric material 172. These structures are merely examples and various modifications may be made.

Figure 8:
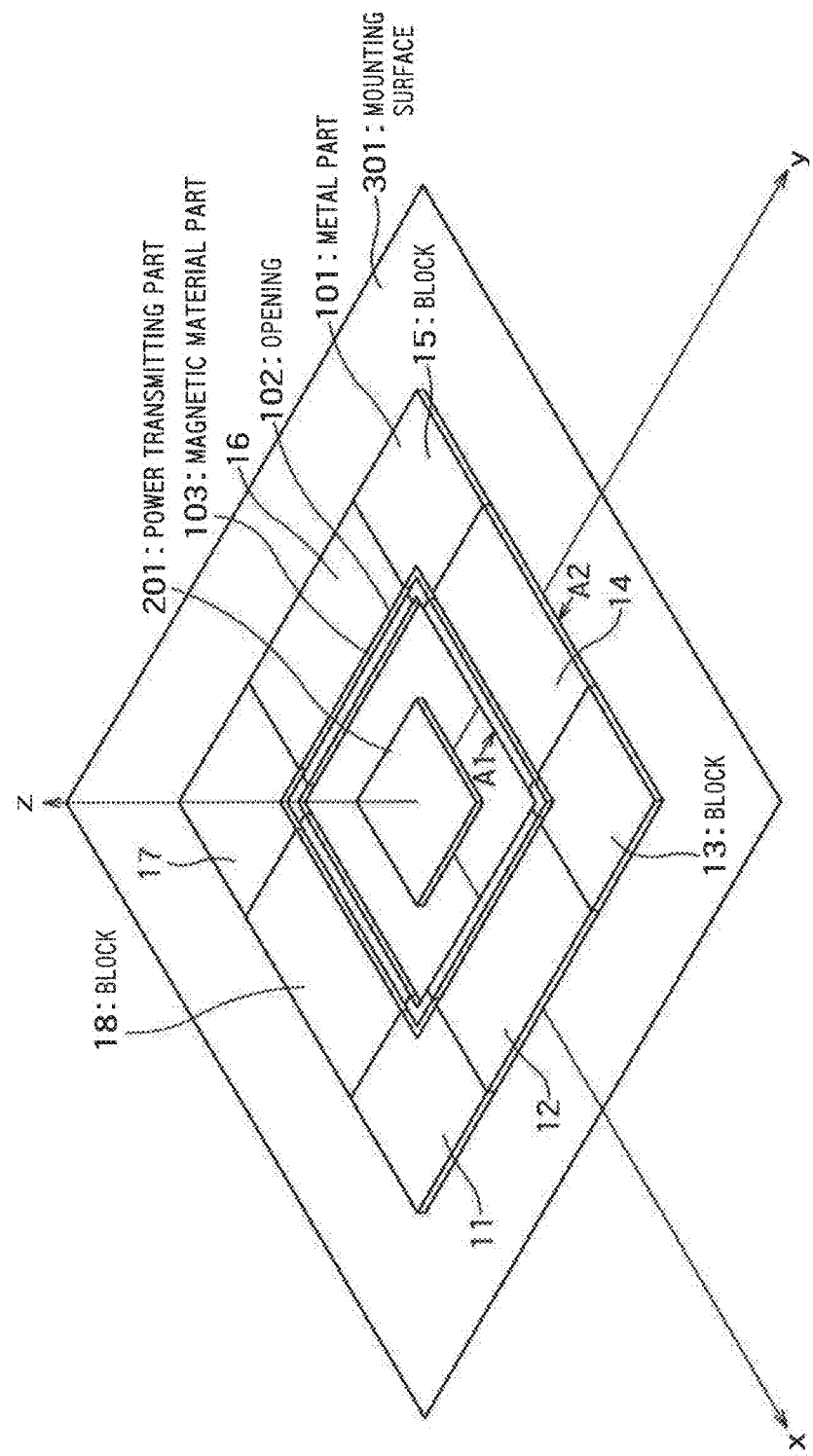
FIG. 8 is a diagram showing yet another modification example of the leakage preventing device according to the first embodiment.

Note that the leakage preventing device shown in FIG. 1 may be formed physically into one body, or may be, as shown in FIG. 8, formed by dividing the leakage preventing device into a plurality of blocks 11, 12, 13, 14, 15, 16, 17, and 18 and arranging these blocks. No gap preferably exists between the neighboring blocks, but there is no problem so long as a gap may be sufficient small as much as about 1/100 of the wavelength. Here, surfaces of the neighboring blocks to be coupled to each other may be covered with the dielectric material. However, the relevant surface must not be covered with metal.

Second Embodiment

Figure 9:
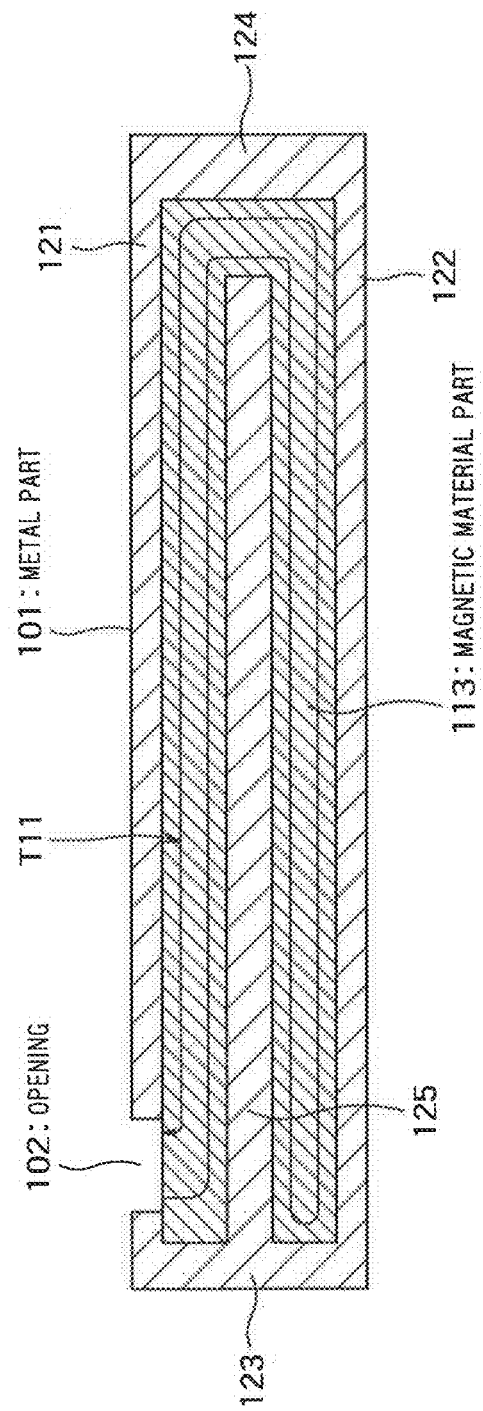
FIG. 9 is a sectional view showing a structure example of an leakage preventing device of an electromagnetic wave according to a second embodiment.

FIG, 9 is a sectional view showing a structure example of a leakage preventing device of an electromagnetic wave according to the second embodiment. An appearance of the leakage preventing device of this embodiment is the same as that of FIG. 1, and FIG. 9 shows the sectional view corresponding to that taken along A1-A2 line of FIG. 1.

The metal part (metal pipe) 101 has a metal plate 125 arranged therein along the circumferential direction. One end of the metal plate 125 is coupled with near the center of an inner wall of the inward lateral side part 123 and the other end thereof is free. The metal plate 125 defines a meandering path in the pipe which is turned back between the inward lateral side part and the outward lateral side part. A magnetic material part 113 is formed so as to fill the meandering path to result in having a folded structure. Here, the magnetic material part 113 is formed along the circumferential direction of the pipe similarly to the first embodiment. The meandering path formed in the pipe allows the device to be reduced in size or in area.

A propagation path T11 is a path for the electromagnetic wave which enters from the opening 102, is propagated in the pipe, and is reradiated from the opening 102. A length of the propagation path T11 is preferably about ½ of the wavelength in pipe, and may be equal to or more than ¼ and equal to or less than ¾ of the wavelength in pipe. As one structure example, a total length of a length from the opening 102 to one of the inward lateral side part 123 and the outward lateral side part 124 (outward lateral side part 124 in the example of FIG. 9) and a length between the inward lateral side part 123 and the outward lateral side part 124 may be equal to or more than ⅛ and equal to or less than ⅜ of the wavelength in pipe.

The other end of the metal plate 125 may be coupled with the inner wall of the outward lateral side part 124 to make one end of the metal plate 125 free. Alternatively, both one end and the other end of the metal plate 125 may be made free and the metal plate 125 may be embedded inside the magnetic material part 113.

Figure 10:
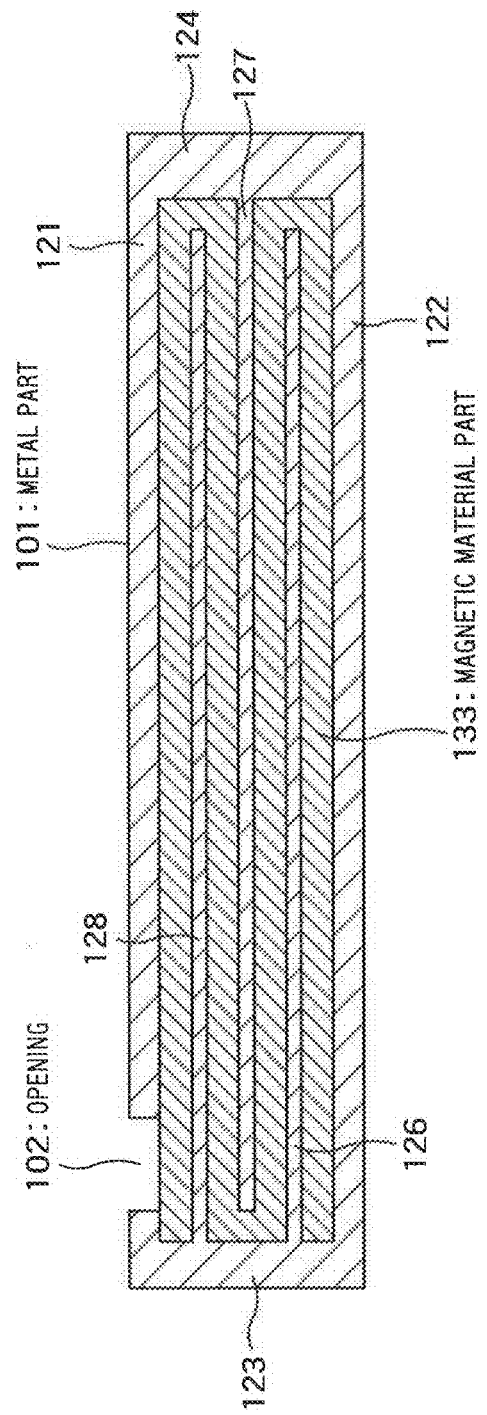
FIG. 10 is a sectional view showing another structure example of the leakage preventing device according to the second embodiment.

FIG. 10 is a sectional view showing another structure example of the leakage preventing device according to the second embodiment. Difference in the structure from FIG. 9 is that the number of the metal plates arranged in the pipe is increased from one to three. One ends of each of metal plates 128 and 126 are coupled with the inward lateral side part 123 and the other ends thereof are free. One end of a metal plate 127 is coupled with the outward lateral side part 124, and the other end thereof is free. These metal plates define a meandering path increased in the folding number compared with the case in FIG. 9. The magnetic material part 133 is formed so as to fill the meandering path to result in having a folded structure. As one structure example, a total length of a length from the opening 102 to one of the inward lateral side part 123 and the outward lateral side part 124 (outward lateral side part 124 in the example of FIG. 9) and three times a length between the inward lateral side part 123 and the outward lateral side part 124 may be equal to or more than ⅛ and equal to or less than ⅜ of the wavelength in pipe. More generally, depending on the folding number N (N is integer), a total length of a length from the opening 102 to one of the inward lateral side part 123 and the outward lateral side part 124, and N times a length between the inward lateral side part 123 and the outward lateral side part 124 may be equal to or more than ⅛ and equal to or less than ⅜ of the wavelength in pipe.

The structure in FIG. 10 is adopted to allow the reduction in size as compared with the structure in FIG. 9.

Figure 11:
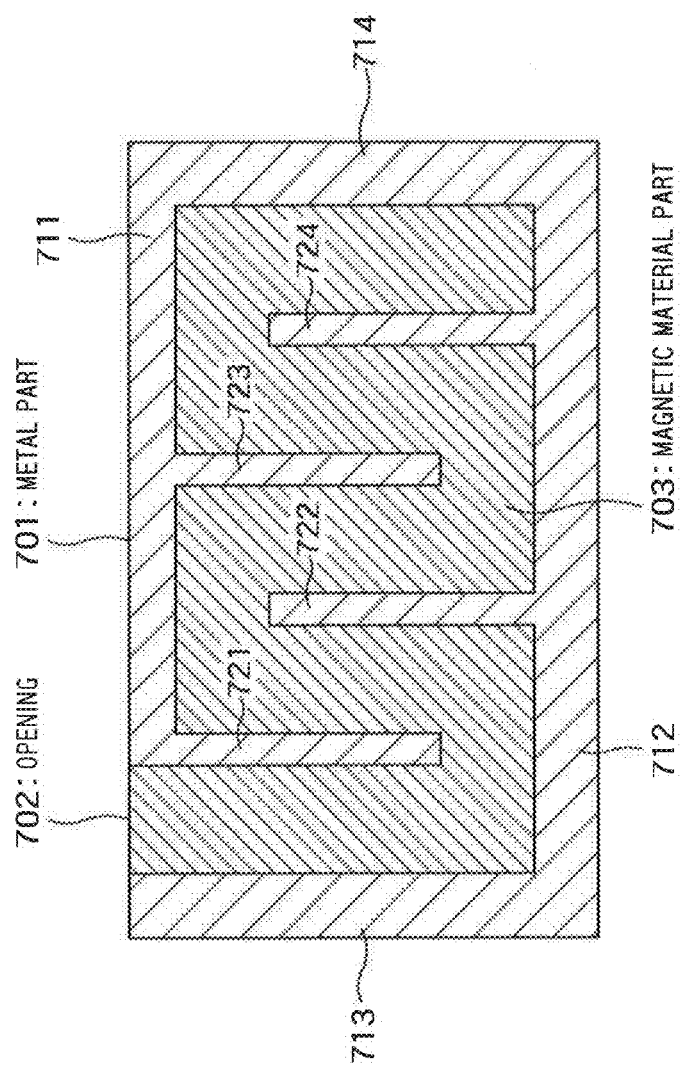
FIG. 11 is a sectional view showing still another structure example of the leakage preventing device according to the second embodiment.

FIG. 11 is a sectional view showing still another structure example of the leakage preventing device according to the second embodiment. A metal pipe (metal part) 701 includes a front side part 711, back side part 712, inward lateral side part 713, and outward lateral side part 714. The metal pipe 701 has metal plates 721, 722, 723, and 724 arranged therein. One ends of each of the metal plates 721 and 723 are coupled with an inner wall of the front side part 711, and the other ends thereof are free. One ends of each of the metal plates 722 and 724 are coupled with an inner wall of the back side part 712, and the other ends thereof are free. These metal plates define a meandering path in the pipe which is turned back plural times between the front side part and the back side part. A magnetic material part 703 is formed so as the fill the meandering path to result in having a folding structure. This structure also allows the reduction in size of the device.

Third Embodiment

Figure 12:
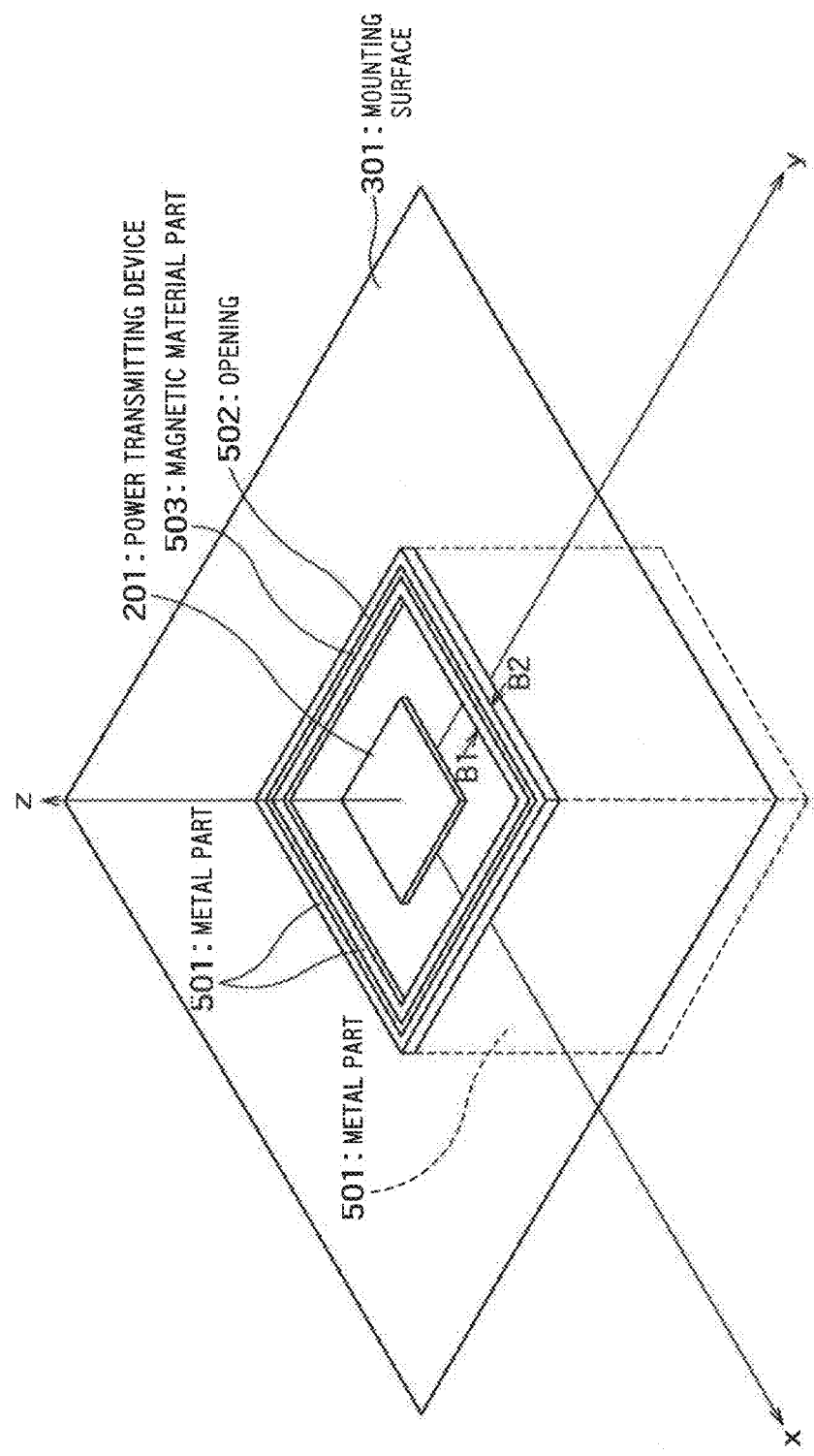
FIG. 12 is a perspective view showing a wireless power transmission system provided with an leakage preventing device of an electromagnetic wave according to a third embodiment.
Figure 13:
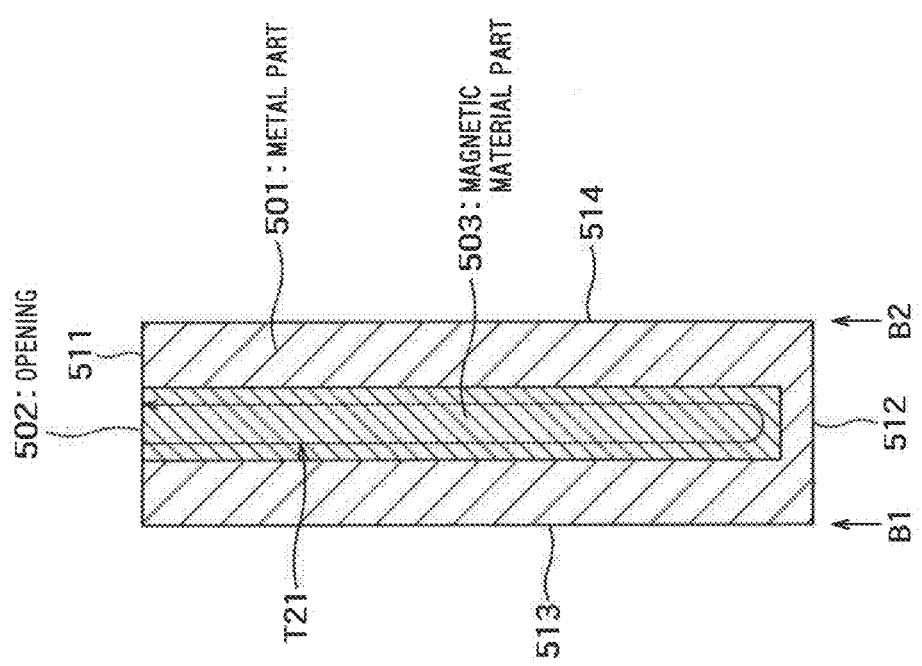
FIG. 13 is a sectional view of the leakage preventing device taken along a B1-B22 line of FIG. 12.

FIG. 12 is a perspective view of a wireless power transmission system provided with a leakage preventing device of an electromagnetic wave according to a third embodiment. FIG. 13 is a sectional view taken along B1-B22 line of FIG. 12, In the first embodiment, the leakage preventing device is arranged on the ground plane (mounting surface) 301 to generally have a flat shape. On the other hand, in this embodiment, a part of the device is embedded in the ground to have generally a shape extended in the z-axis direction. The portion embedded in the ground is represented with a dotted line.

A metal part (metal pipe) 501 has a structure like a ring which is obtained by coupling both ends of a metal square tube to each other. The metal pipe 501 has, as shown in FIG. 13, a front side part 511, back side part 512, inward lateral side part 513, and outward lateral side part 514. The front side part 511 has an opening 502 formed thereon along a circumferential direction of the metal pipe 501. In addition, the magnetic material part 503 is formed in the metal pipe 501 along the circumferential direction of the metal pipe 501. The magnetic material part 503 is formed so as to entirely fill the inside of the pipe. However, similarly to the first embodiment, a space or dielectric material may exist in a part of the inside of the pipe.

A propagation path T21 is a path for the electromagnetic wave which enters in the opening 502, is propagated in the pipe, and is reradiated. A length of the propagation path T21 is preferably about ½ of the wavelength in pipe, and may be equal to or more than ¼ and equal to or less than ¾ of the wavelength in pipe.

A description will be given of an operation simulation of the leakage preventing device according to the third embodiment using FIG. 14, FIG. 15, FIG. 16, and FIG. 17.

Figure 14:
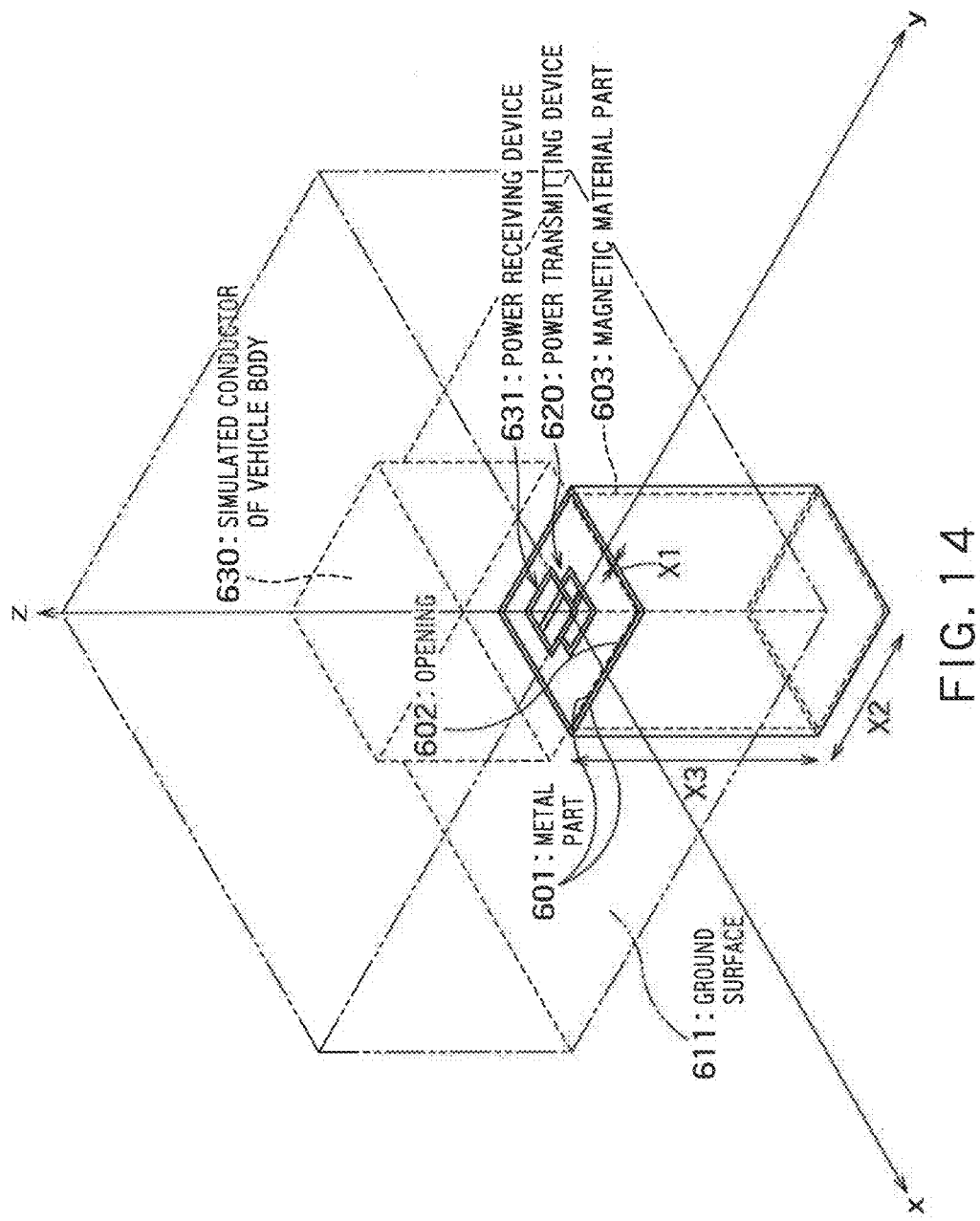
FIG. 14 is a diagram showing a device configuration performing a simulation according to the third embodiment.

FIG. 14 shows a state where the leakage preventing device (metal part 601, opening 602, magnetic material part 603) according to the third embodiment is arranged with respect to a power transmitting device 620. This leakage preventing device has the same structure as in FIG. 12, of which detailed description is omitted. The power transmitting device 620 includes the power transmitting coil, electric power generating unit, and the like. For the purpose of simplification, the power transmitting device 620 is expressed in a picture of the power transmitting coil in the figure. Assuming a situation where a power receiving device 631 is arranged in the vehicle body, and the vehicle body is parked such that the power receiving device 631 faces the power transmitting device. The vehicle body is expressed as simulated conductor 630 of the vehicle body. The electric power transmitted from the power transmitting device 620 to the power receiving device 631 is accumulated in a storage battery in the vehicle body, for example.

Figure 15:
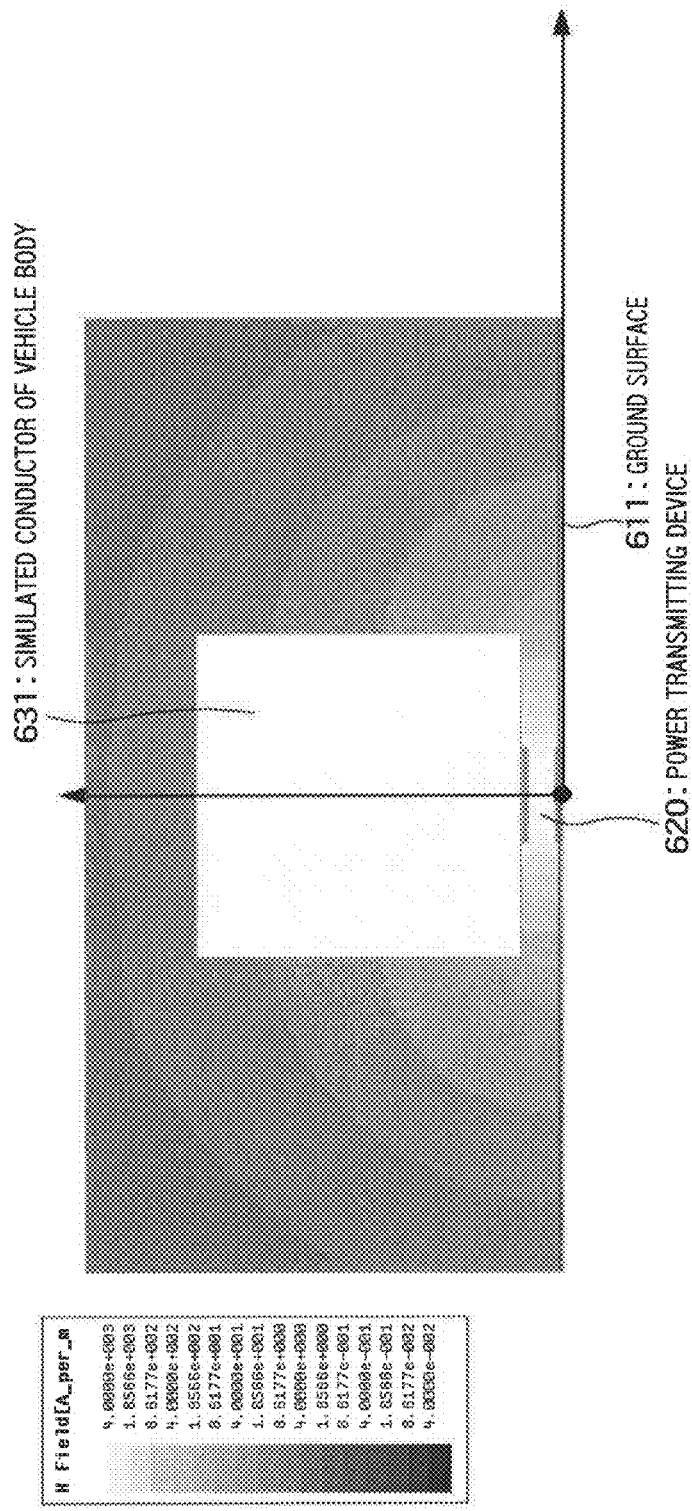
FIG. 15 is a diagram showing a magnetic field distribution in the vicinity of a power transmitting device of related art on transmitting electric power.
Figure 16:
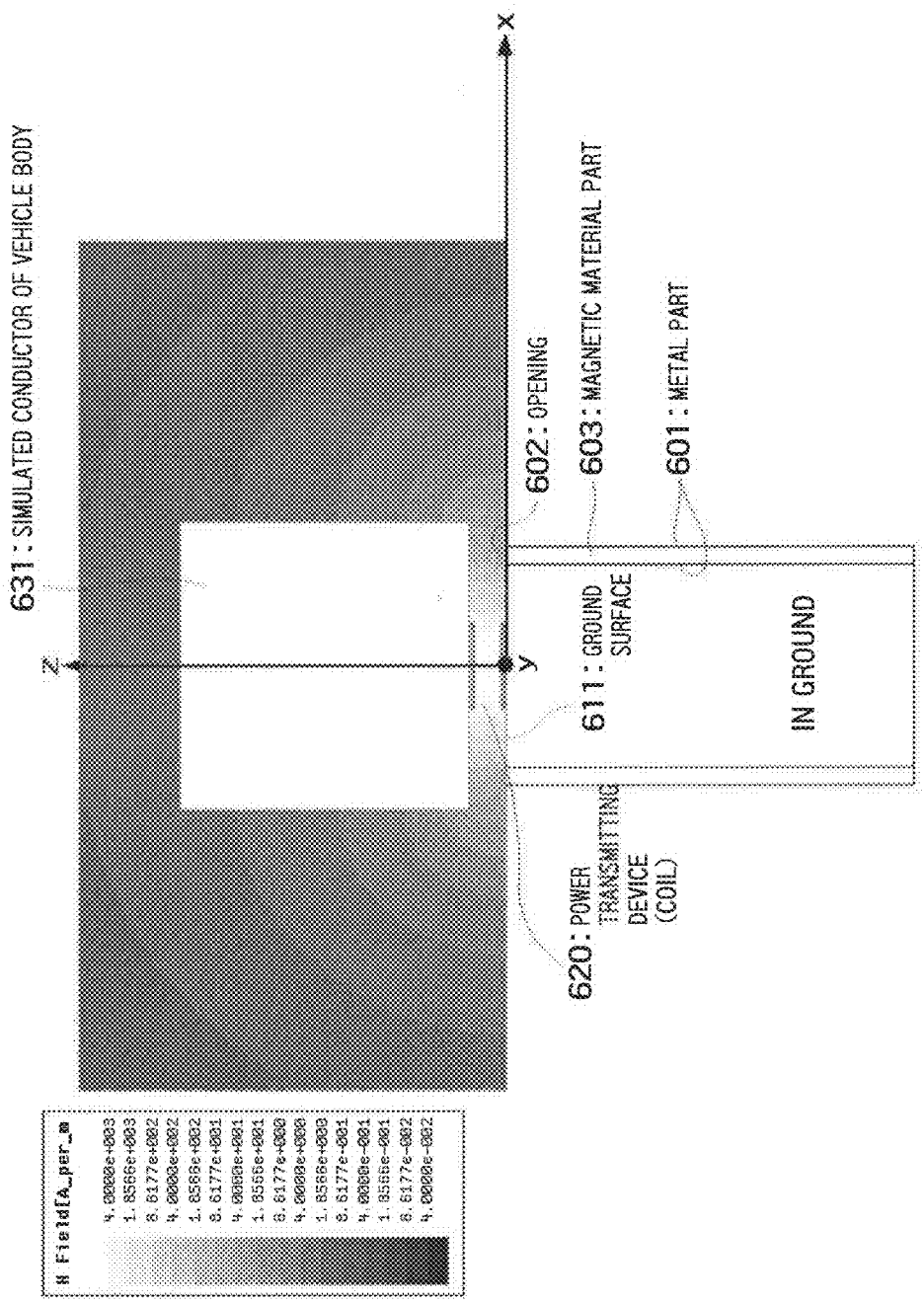
FIG. 16 is a diagram showing a magnetic field distribution in the vicinity of a power transmitting device in a case of using the leakage preventing device according to the third embodiment.
Figure 17:
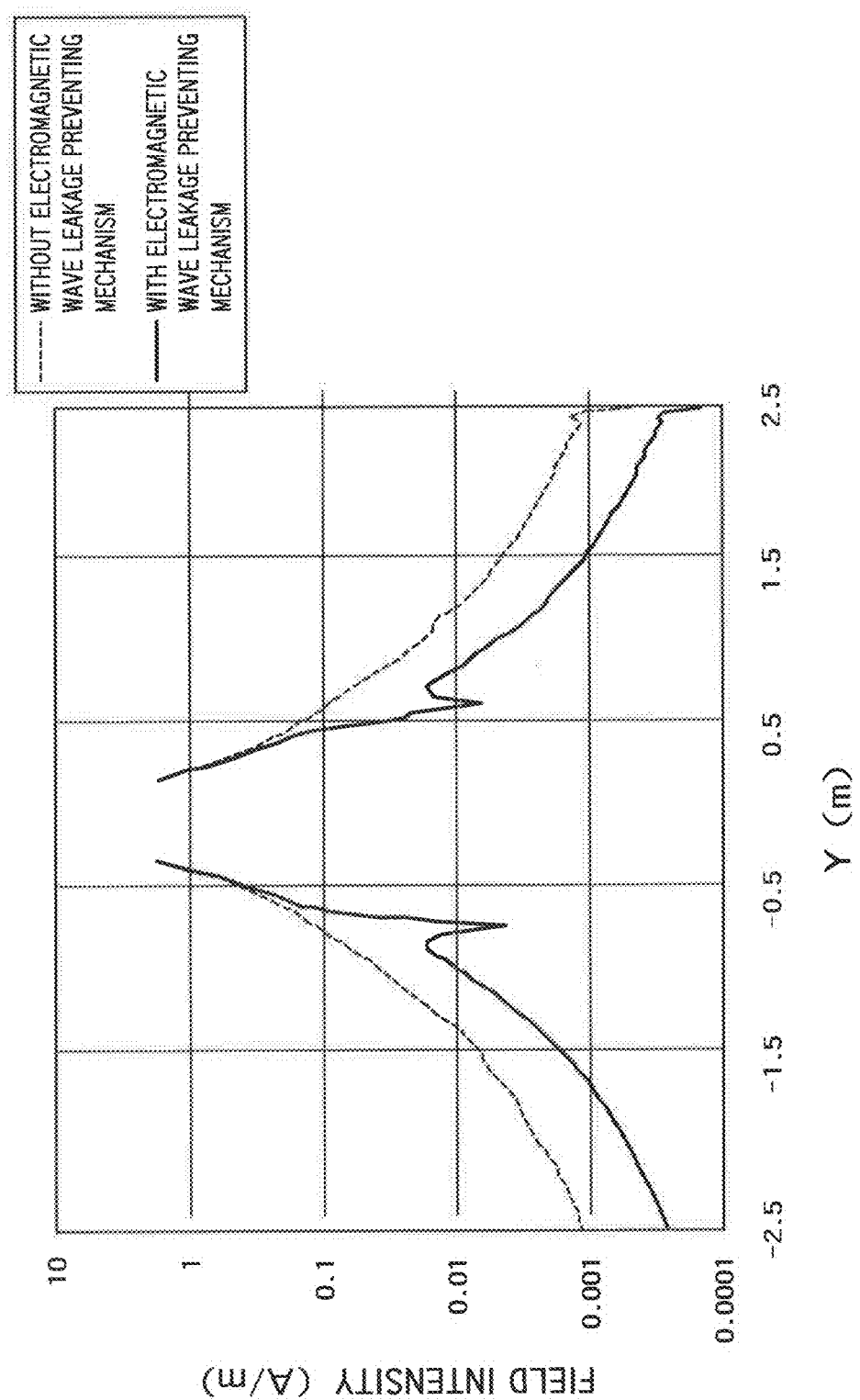
FIG. 17 is a diagram showing a graph explaining an effect of the third embodiment.

Given that the relative permeability is 100,000, and the magnetic material part has a width of 10 cm (X1 in FIG. 14), a 1.4 m on a side (X2 in FIG. 14) base, and a thickness of 2.4 m (X3 in FIG. 14). At this time, an electromagnetic wave leakage preventing effect according to this device is analyzed by an electromagnetic field simulator with a frequency of 100 kHz, FIG. 16 shows a magnetic field distribution in the vicinity of the power transmitting device 620 which is obtained by simulation using a configuration of FIG. 14. FIG. 15 shows a magnetic field distribution in the vicinity of the power transmitting device in a case of simulation using a configuration in which the leakage preventing device is removed from the configuration of FIG. 14. FIG. 17 shows each of the distributions shown in FIG. 16 and FIG. 15 in a graphic form. A horizontal axis represents a position in the Y-axis direction, and a vertical axis represents field intensity. A position having a value 0 on the Y-axis is defined as an arrangement position for the power transmitting device. In comparison of these graphs with each other, it can be confirmed that the electromagnetic wave leaking to the periphery of the power transmitting device considerably decreases.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A leak preventing device of electromagnetic wave comprising:
    a metal pipe arranged to surround a periphery of a first electric power transmission device, the first electric power transmission device wirelessly transmitting electric power to a second electric power transmission device via an electromagnetic wave, the second electric power transmission device being opposed to the first electric power transmission device;
    an opening formed on the metal pipe along a circumferential direction of the metal pipe; and
    a magnetic material part arranged within the metal pipe along the circumferential direction the metal pipe.

2. The leakage preventing device according to claim 1, wherein
    a part of the electromagnetic wave enters from the opening, is propagated and reflected in the metal pipe, and is reradiated from the opening, and
    a length of a longest propagation path of the electromagnetic wave from entering the opening to reradiating in the metal pipe is equal to or more than ¼ and equal to or less than ¾ of a wavelength in pipe.

3. The leakage preventing device according to claim 1, wherein
    the metal pipe has a first surface having the opening formed thereon, a second surface facing the first surface, a third surface formed between one end of the first surface and one end of the second surface, and a fourth surface formed between the other end of the first surface and the other end of the second surface,
    a distance between the third surface of the metal pipe and the fourth surface of the metal pipe is longer than a distance between the first surface and second surface of the metal pipe, and
    a length of a longer one of propagation paths of the electromagnetic wave from the opening to each of the third surface and the fourth surface is equal to or more than ⅛ and equal to or less than ⅜ of a wavelength in pipe.

4. The leakage preventing device according to claim 1, wherein
    the metal pipe has a first surface having the opening formed thereon, a second surface facing the first surface, a third surface formed between one end of the first surface and one end of the second surface, and a fourth surface formed between the other end of the first surface and the other end of the second surface,
    a distance between the third surface of the metal pipe and the fourth surface of the metal pipe is longer than a distance between the first surface and second surface of the metal pipe, and
    a length of a longer one of a length from the opening to the third surface or a length from the opening to the fourth surface is equal to or more than ⅛ and equal to or less than ⅜ of a wavelength in pipe.

5. The leakage preventing device according to claim wherein
the metal pipe has a first surface having the opening formed thereon, a second surface facing the first surface, a third surface formed between one end of the first surface and one end of the second surface, and a fourth surface formed between the other end of the first surface and the other end of the second surface,
a distance between the first surface and the second surface is longer than a distance between the third surface and the fourth surface, and
a length of a propagation path of the electromagnetic wave from the opening to the second surface is equal to or more than 1/8 and equal to or less than 3/8 of a wavelength in pipe.

6. The leakage preventing device according to claim wherein
the metal pipe has a first surface having the opening formed thereon, a second surface facing the first surface, a third surface formed between one end of the first surface and one end of the second surface, and a fourth surface formed between the other end of the first surface and the other end of the second surface,
a distance between the first surface and the second surface is longer than a distance between the third surface and the fourth surface, and
a length from the opening to the second surface is equal to or more than 1/8 and equal to or less than 3/8 of a wavelength in pipe.

7. The leakage preventing device according to claim 1, wherein
at least one metal plate is arranged in the metal pipe along the circumferential direction of the metal pipe and a meandering propagation path is formed in the metal pipe by the metal plate.

8. The leakage preventing device according to claim 7, wherein
the metal pipe has a first surface having the opening formed thereon, a second surface facing the first surface, a third surface formed between one end of the first surface and one end of the second surface, and a fourth surface formed between the other end of the first surface and the other end of the second surface,
a distance between the third surface of the metal pipe and the fourth surface of the metal pipe is longer than a distance between the first surface and second surface of the metal pipe, and
a total length of a length from the opening to any one of the third surface and the fourth surface and an integral multiple of a length between the third surface and the fourth surface is equal to or more than 1/8 and equal to or less than 3/8 of a wavelength in pipe.

9. The leakage preventing device according to claim 7, wherein
the metal pipe has a first surface having the opening formed thereon, a second surface facing the first surface, a third surface formed between one end of the first surface and one end of the second surface, and a fourth surface formed between the other end of the first surface and the other end of the second surface, and
one end of the metal plate is coupled with the third surface of the metal pipe or the fourth surface of the metal pipe, and the other end of the metal plate is free.

10. The leakage preventing device according to claim wherein
the metal pipe has a first surface having the opening formed thereon, a second surface facing the first surface, a third surface formed between one end of the first surface and one end of the second surface, and a fourth surface formed between the other end of the first surface and the other end of the second surface, and
one end of the metal plate is coupled with the first surface of the metal pipe or the second surface of the metal pipe, and the other end of the metal plate is free.

11. The leakage preventing device according to claim 7, wherein
the magnetic material part is arranged along the meandering propagation path.

12. The leakage preventing device according to claim 1, wherein
the leakage preventing device is arranged on a conductor plate.

13. A wireless power transmission system comprising:
a first electric power transmission device as recited in claim 1; and
an leakage preventing device as recited in claim 1.

14. A leakage preventing device of an electromagnetic wave comprising:
a metal pipe arranged to surround a periphery of a first electric power transmission device, the first electric power transmission device wirelessly transmitting electric power to a second electric power transmission device via an electromagnetic wave, the second electric power transmission device being opposed to the first electric power transmission device;
an opening formed on the metal pipe along a circumferential direction of the metal pipe; and
a magnetic material part arranged in the metal pipe along the circumferential direction the metal pipe,
wherein
the metal pipe has a second surface facing the opening, a third surface formed between the opening and one end the second surface, and a fourth surface formed between the opening and the other end of the second surface, and
a distance between the opening and the second surface is longer than a distance between the opening and the third surface plus a distance between the third surface and the fourth surface, and a length from the opening to the second surface is equal to or more than 1/8 and equal to or less than 3/8 of a wavelength in pipe.

* * * * *